(12) United States Patent
Takahashi et al.

(10) Patent No.: US 11,271,058 B2
(45) Date of Patent: Mar. 8, 2022

(54) DISPLAYING APPARATUS IN WHICH A LEAK CURRENT BETWEEN PIXELS IS SUPPRESSED

(71) Applicant: CANON KABUSHIKI KAISHA, Tokyo (JP)

(72) Inventors: Tetsuo Takahashi, Kawasaki (JP); Hiroaki Sano, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/878,080

(22) Filed: May 19, 2020

(65) Prior Publication Data

US 2020/0381499 A1 Dec. 3, 2020

(30) Foreign Application Priority Data

May 27, 2019 (JP) .............................. JP2019-098810

(51) Int. Cl.
*H01L 29/08* (2006.01)
*H01L 27/32* (2006.01)
*H01L 51/56* (2006.01)
*G09G 3/3258* (2016.01)
*H01L 51/52* (2006.01)

(52) U.S. Cl.
CPC ....... *H01L 27/3258* (2013.01); *G09G 3/3258* (2013.01); *H01L 27/3218* (2013.01); *H01L 27/3276* (2013.01); *H01L 51/5275* (2013.01); *H01L 51/56* (2013.01)

(58) Field of Classification Search
CPC ............. H01L 27/3258; H01L 27/3218; H01L 27/3276; H01L 51/5275; H01L 51/56; G09G 3/3258
See application file for complete search history.

(56) References Cited

U.S. PATENT DOCUMENTS

| | | | |
|---|---|---|---|
| 8,581,275 B2 | 11/2013 | Omoto | |
| 8,987,760 B2 | 3/2015 | Omoto | |
| 10,651,422 B2 | 5/2020 | Kajimoto | |
| 2011/0031514 A1* | 2/2011 | Sakaguchi | ............. H05B 33/04 257/88 |

(Continued)

FOREIGN PATENT DOCUMENTS

| | | |
|---|---|---|
| JP | 2012-155953 A | 8/2012 |
| JP | 2014-52582 A | 3/2014 |
| JP | 2018-78095 A | 5/2018 |

*Primary Examiner* — Phuc T Dang
(74) *Attorney, Agent, or Firm* — Venable LLP

(57) ABSTRACT

A displaying apparatus in which a plurality of pixels each including an organic light emitting element are arrayed in a pixel region, comprising a plurality of lower electrodes arrayed on a substrate in correspondence with the plurality of pixels, a first insulating layer covering an upper surface of the substrate and at least side surfaces of the plurality of lower electrodes, an organic compound layer provided all over the pixel region to cover the plurality of lower electrodes and the first insulating layer, an upper electrode provided all over the pixel region to cover the organic compound layer, and an interpixel electrode provided between the plurality of lower electrodes to be arranged along a boundary of the plurality of pixels under the organic compound layer and above the first insulating layer.

19 Claims, 9 Drawing Sheets

(56) References Cited

U.S. PATENT DOCUMENTS

| | | | |
|---|---|---|---|
| 2012/0133575 A1* | 5/2012 | Hasegawa | H01L 51/5275 345/76 |
| 2012/0187425 A1 | 7/2012 | Omoto | |
| 2013/0048968 A1* | 2/2013 | Takaya | H01L 51/504 257/40 |
| 2014/0124765 A1 | 5/2014 | Omoto | |
| 2017/0222156 A1* | 8/2017 | Kawakami | C09K 11/06 |
| 2019/0252644 A1 | 8/2019 | Kajimoto | |
| 2019/0393272 A1 | 12/2019 | Kajimoto et al. | |

* cited by examiner

DISPLAYING APPARATUS IN WHICH A LEAK CURRENT BETWEEN PIXELS IS SUPPRESSED

BACKGROUND OF THE INVENTION

Field of the Invention

The present invention mainly relates to a displaying apparatus.

Description of the Related Art

Japanese Patent Laid-Open Nos. 2012-155953 and 2014-52582 describe an organic light emitting element used in a displaying apparatus used for the electronic viewfinder of a camera, the display of a TV, the display panel of a portable terminal, or the like. The displaying apparatus is also called an organic EL display. For example, a plurality of organic light emitting elements capable of generating white light are arrayed on a substrate, and color filter layers (for example, color filters of red, green, blue, and the like) are provided above them, thereby implementing a displaying apparatus capable of performing color display.

When the pixel density is increased, it is considered that electric interference (crosstalk) occurs between two pixels adjacent to each other. For example, it is considered that although a pixel is driven to emit light, another pixel adjacent to that partially emits light. This may lead to deterioration of the quality of an image.

SUMMARY OF THE INVENTION

It is an exemplary object of the present invention to implement both a high pixel density and high quality of an image by a relatively simple arrangement.

According to one aspect of the present invention, there is provided a displaying apparatus in which a plurality of pixels each including an organic light emitting element are arrayed in a pixel region, comprising a plurality of lower electrodes arrayed on a substrate in correspondence with the plurality of pixels, a first insulating layer configured to cover an upper surface of the substrate and at least side surfaces of the plurality of lower electrodes to electrically isolate the plurality of lower electrodes from each other, an organic compound layer provided all over the pixel region to cover the plurality of lower electrodes and the first insulating layer, an upper electrode provided all over the pixel region to cover the organic compound layer, and an interpixel electrode provided between the plurality of lower electrodes to be arranged along a boundary of the plurality of pixels under the organic compound layer and above the first insulating layer.

Further features of the present invention will become apparent from the following description of exemplary embodiments (with reference to the attached drawings).

DESCRIPTION OF THE EMBODIMENTS

Figure 1A:
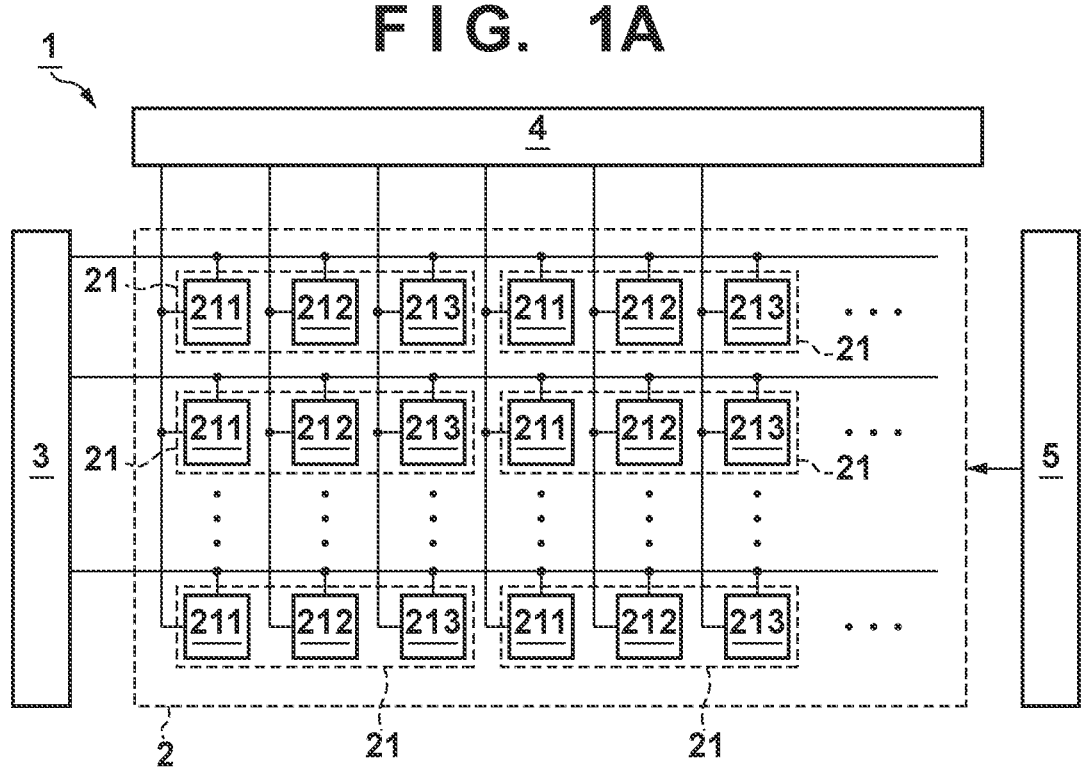
FIG. 1A is a view for explaining an arrangement example of a displaying apparatus.

Hereinafter, embodiments will be described in detail with reference to the accompanying drawings. It should be noted that the following embodiments are not intended to limit the scope of the appended claims. A plurality of features are described in the embodiments. Not all the plurality of features are essential for the present invention, and the plurality of features may arbitrarily be combined. In addition, the same reference numerals denote the same or similar parts in the accompanying drawings, and a repetitive description will be omitted.

First Embodiment

Example of Arrangement of Displaying Apparatus

FIG. 1A shows an example of the arrangement of a displaying apparatus 1 according to the first embodiment. In this embodiment, the displaying apparatus 1 is an organic EL display (Organic Electro-Luminescence Display), and includes a pixel array 2, a scanning signal driver 3, an information signal driver 4, and a voltage supply unit 5.

The pixel array 2 includes a plurality of pixels 211 to 213 that are arrayed in a matrix (to form a plurality of rows and a plurality of columns). The pixel 211 is configured to generate red light, the pixel 212 is configured to generate green light, and the pixel 213 is configured to generate blue light, as will be described later in detail. The pixels 211, 212, and 213 can also be expressed as a red pixel, a green pixel, and a blue pixel, respectively. The plurality of pixels 211 to 213 are arrayed with three pixels 211 to 213 as one unit. The emission light components are combined, and their light amounts are adjusted, thereby emitting light in a variety of colors. From this viewpoint, the three pixels 211 to 213 may collectively be expressed as "pixel 21", and the pixels 211 to 213 may be expressed as "subpixels 211 to 213". In the following explanation, the pixels 211 to 213 can be expressed as "pixels 211 and the like" if they are not particularly discriminated.

The scanning signal driver 3 supplies a scanning signal SIG3 to the pixels 211 and the like on a row basis via a signal line provided for each row. The information signal driver 4 supplies an information signal SIG4 to the pixels 211 and the like on a column basis via a signal line provided for each column. The voltage supply unit 5 supplies a predetermined voltage (for example, a reference voltage such as a ground voltage) to the pixels 211 and the like. With this arrangement, the pixels in the pixel array 2 can individually be driven. All the scanning signal driver 3, the information signal driver 4, and the voltage supply unit 5 correspond to a driving unit configured to drive the pixel array 2.

Figure 1B:
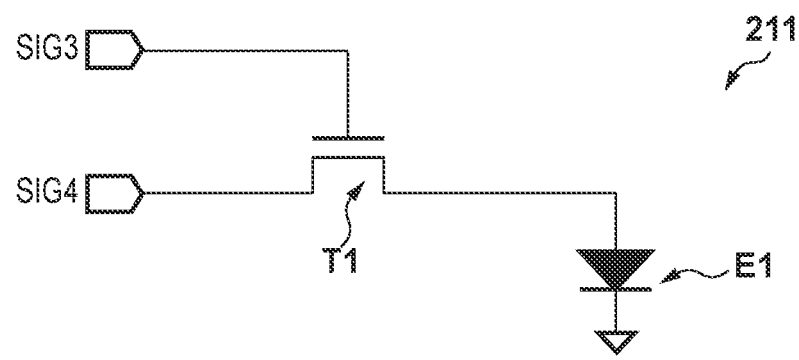
FIG. 1B is a view for explaining an arrangement example of the displaying apparatus.

FIG. 1B shows an example of the arrangement of the pixel 211. The pixel 211 includes an organic light emitting element (Organic Light-Emitting Diode (OLED)) E1 and a transistor T1. The organic light emitting element E1 is formed by an organic compound layer that emits light in accordance with voltage application, as will be described later in detail. A known switch element such as a MOS transistor or a thin film transistor is used as the transistor T1. In this embodiment, the transistor T1 is connected to the anode of the organic light emitting element E1 via the source terminal, receives the scanning signal SIG3 via the gate terminal, and receives the information signal SIG4 via the drain terminal. The cathode of the organic light emitting element E1 is grounded by the voltage supply unit 5.

In this arrangement, when selected by receiving the scanning signal SIG3 from the scanning signal driver 3, the pixel 211 is driven in accordance with the reception of the information signal SIG4 of activation level from the information signal driver 4, and the organic light emitting element E1 thus emits light. As an example, in a case in which the transistor T1 is an n-channel transistor, when both the scanning signal SIG3 and the information signal SIG4 are at high level, the transistor T1 is turned on, and the organic light emitting element E1 is driven to emit light. The amount of emission light of the organic light emitting element E1 complies with the signal value of the information signal SIG4. The arrangement of the pixel 211 has been described here. This also applies to the remaining pixels 212 and 213.

Note that the pixels 211 and the like may be configured to be driven by a logic level different from FIG. 1B. For example, the organic light emitting element E1 may be provided such that the anode is fixed to a power supply voltage, and the cathode is connected to the transistor T1.

Red, green, and blue color filters are provided in the pixels 211, 212, and 213 to cover the organic light emitting elements E1, as will be described later in detail. In this embodiment, the organic light emitting element E1 emits white light. When the organic light emitting elements E1 emit light, light components of colors corresponding to the color filters are emitted from the pixels 211, 212, and 213.

Figure 1C:
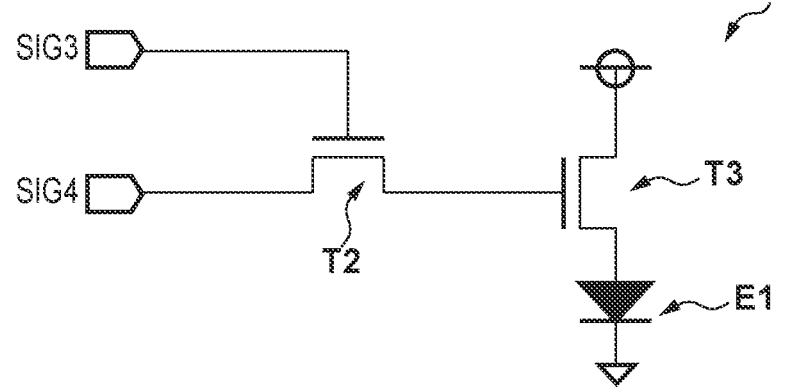
FIG. 1C is a view for explaining an arrangement example of the displaying apparatus.

The example shown in FIG. 1B exemplifies the arrangement of the pixel 211 including the single transistor T1 for descriptive convenience. However, the arrangement is not limited to this example. For example, as shown by a pixel 211' in FIG. 1C, transistors T2 and T3 may be used in place of the transistor T1. In this example, the transistor T2 is connected to the gate terminal of the transistor T3 via the source terminal, receives the scanning signal SIG3 via the gate terminal, and receives the information signal SIG4 via the drain terminal. In addition, the transistor T3 is arranged between a power supply potential and a ground potential and is connected in series with the organic light emitting element E1. Such an arrangement can also implement the same function as the pixel 211, and this also applies to the remaining pixels 212 and 213.

Structure Example of Pixel Array

Figure 2:
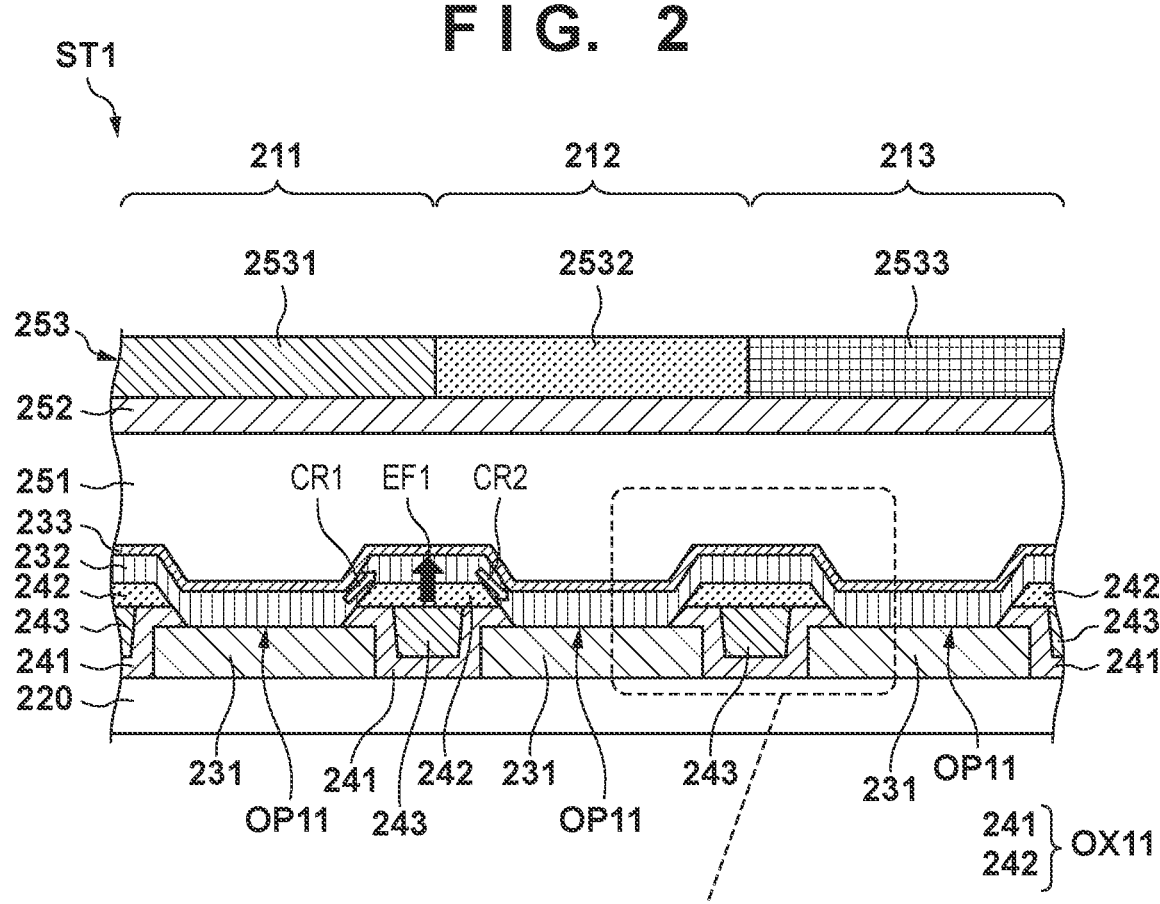
FIG. 2 is a schematic view for explaining an example of a pixel structure.
Figure 2:
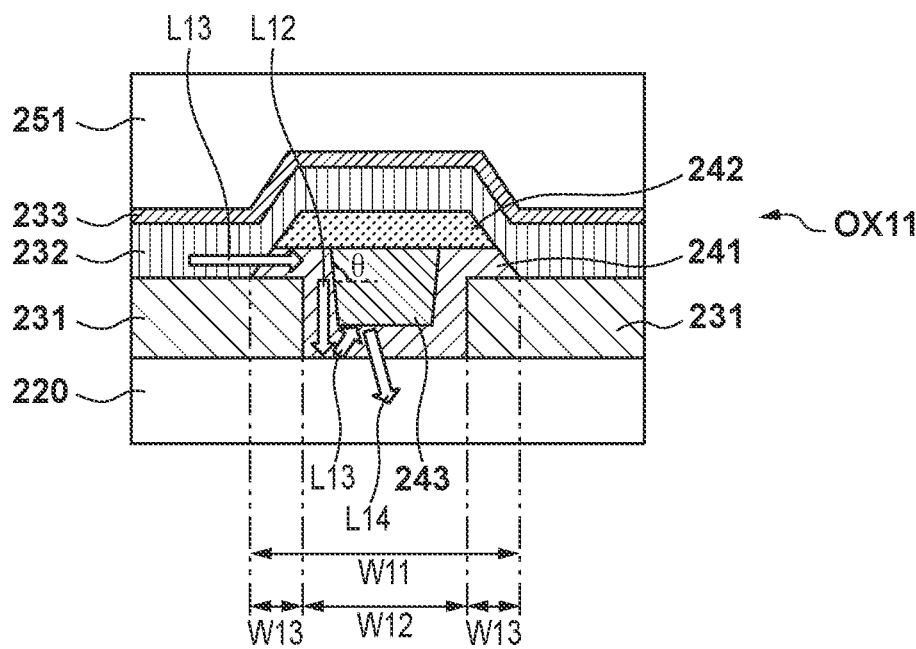

FIG. 2 is a schematic sectional view showing a structure (to be simply referred to as a "pixel structure" hereinafter) ST1 for implementing the above-described pixel array 2. The pixel structure ST1 is formed by arraying the above-described pixels 211 and the like in a pixel region on a substrate 220. The pixel region is typically formed at the center portion of the substrate 220. The peripheral portion is used as a connecting region configured to electrically connect the pixel array 2 to the scanning signal driver 3, the information signal driver 4, or the voltage supply unit 5. As the substrate 220, a predetermined plate member on which the constituent elements of the pixel array 2 can be formed by a known manufacturing process, for example, a silicon substrate, a glass substrate, or the like is used. The pixel structure ST1 includes a plurality of lower electrodes 231, an organic compound layer 232, an upper electrode 233, insulating layers 241 and 242, an interpixel electrode 243, a sealing layer 251, a planarization layer 252, and a color filter layer 253.

The plurality of lower electrodes 231 are arrayed in a matrix on the substrate 220 and provided in correspondence with the plurality of pixels 211 and the like, respectively. Each lower electrode 231 corresponds to the anode of the organic light emitting element E1 described with reference to FIG. 1B. The insulating layers 241 and 242 and the interpixel electrode 243 are provided between the lower electrodes 231 adjacent to each other, as will be described later in detail.

The organic compound layer 232 is provided to cover the plurality of lower electrodes 231, the insulating layers 241 and 242, and the interpixel electrode 243, and extends all over the pixel region. The organic compound layer 232 is configured to emit light in accordance with application of a voltage, and is formed by stacking layers such as a light emitting layer (recombination layer), a charge injection layer, a charge transport layer, a hole injection layer, and a hole transport layer, which are at least partially made of organic materials, although a detailed description thereof will be omitted.

The upper electrode 233 is provided to cover the organic compound layer 232, and extends all over the pixel region, like the organic compound layer 232. The upper electrode 233 corresponds to the cathode of the organic light emitting element E1 described with reference to FIG. 1B.

The first insulating layer 241 is provided to cover the upper surface of the substrate 220 between the lower electrodes 231 adjacent to each other and also cover the side surface and the peripheral portion of the upper surface of each lower electrode 231. The upper surface of the insulating layer 241 forms a concave shape between the lower electrodes 231 adjacent to each other, and the interpixel electrode 243 is provided to fill the concave shape. The second insulating layer 242 is provided on the insulating layer 241 and the interpixel electrode 243.

That is, the interpixel electrode 243 is provided under the organic compound layer 232 and between the plurality of lower electrodes 231 to divide the plurality of pixels 211 and the like. In other words, the interpixel electrode 243 is extended along pixel boundaries. The interpixel electrode 243 may be expressed as a pixel boundary electrode (or simply as a boundary electrode). The insulating layer 241 covers the upper surface of the substrate 220 and the side surfaces of the plurality of lower electrodes 231 to electrically isolate the plurality of lower electrodes 231 from each other, and also covers the side surfaces and the lower surface of the interpixel electrode 243 to electrically insulate the interpixel electrode 243 from the substrate 220 and the plurality of lower electrodes 231. The insulating layer 242 is provided on the insulating layer 241 to cover the upper surface of the interpixel electrode 243 to electrically insulate the interpixel electrode 243 from the organic compound layer 232. The insulating layers 241 and 242 correspond to an insulating member OX11 surrounding the interpixel electrode 243, and the interpixel electrode 243 is thus electrically independent of the plurality of lower electrodes 231.

Figure 5A:
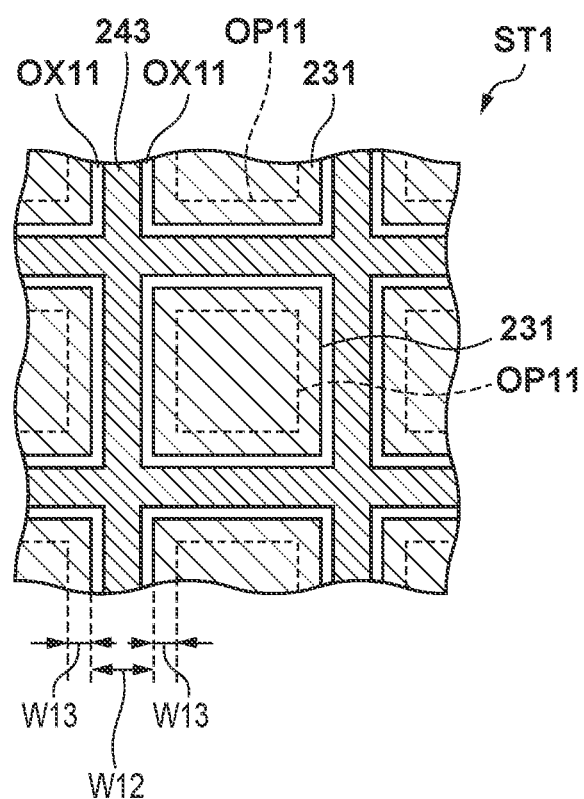
FIG. 5A is a schematic view for explaining the planar layout of the pixel structure.

Here, the interpixel electrode 243 may be arranged without breaking (continuously/integrally) around the lower electrodes 231, as shown in FIG. 5A, or may be arranged while partially breaking (a separated part may exist). That is, division by the above-described interpixel electrode 243 includes both a form in which a single member is continuously arranged along the pixel boundaries, and a form in which a plurality of members are intermittently arranged along the pixel boundaries. Note that an arrangement in which the interpixel electrode 243 is arranged without breaking is preferable because an electric field EF1 to be described later exerts the effect within a wide range.

Although details of each element will be described later, with this structure, the upper surface of the interpixel electrode 243 is located above the upper surface of each of the plurality of lower electrodes 231, and additionally, the lower surface of the interpixel electrode 243 is located above the lower surface of each of the plurality of lower electrodes 231. Additionally, in this embodiment, the side surfaces of the interpixel electrode 243 tilt, and the upper surface of the interpixel electrode 243 is wider than the bottom surface. The insulating member OX11 formed by the insulating layers 241 and 242 includes tilting surfaces above the upper surfaces of the lower electrodes 231, and portions of the organic compound layer 232 immediately above the tilting surfaces of the insulating member OX11 are relatively thin.

The sealing layer 251 is provided to cover the upper electrode 233 all over the pixel region and the connecting region outside the pixel region to seal the plurality of lower electrodes 231, the organic compound layer 232, the upper electrode 233, the insulating layers 241 and 242, and the interpixel electrode 243. The color filter layer 253 is provided on the planarization layer 252 on the sealing layer 251. The color filter layer 253 includes a red filter 2531, a green filter 2532, and a blue filter 2533, which are provided in correspondence with the pixels 211, 212, and 213, respectively.

For each of the above-described elements that constitute the pixel structure ST1, a material that can appropriately implement the function and can be formed by a known manufacturing process is used.

For the lower electrodes 231, a conductive material having a high reflectance to light emitted by the organic light emitting element E1, preferably, a metal having a reflectance of 80% or more, for example, aluminum (Al), silver (Ag), or the like can be used. Alternatively, as an alloy of this/these, a material made by adding silicon (Si), copper (Cu), nickel (Ni), neodymium (Nd), or the like may be used. Additionally, a barrier metal such as titanium (Ti), tungsten (W), molybdenum (Mo), or gold (Au) may be used for the lower electrodes 231.

For the insulating layers 241 and 242, an insulating material such as silicon oxide, silicon nitride, or silicon oxynitride can be used. As will be described later in detail, insulating materials different from each other may be used for the insulating layers 241 and 242. For example, the materials may be selected such that the refractive index of the insulating layer 242 becomes higher than the refractive index of the insulating layer 241.

For the interpixel electrode 243, a conductive material such as aluminum (Al), silver (Ag), copper (Cu), or tungsten (W) can be used. Alternatively, as an alloy of this/these, a material made by adding silicon (Si), nickel (Ni), neodymium (Nd), or the like may be used. Additionally, a barrier metal such as titanium (Ti), tungsten (W), molybdenum (Mo), gold (Au), or tantalum (Ta) may be used for the interpixel electrode 243.

For the upper electrode 233, a light-transmitting conductive material, particularly, a conductive material having a high transmittance to light emitted by the organic light emitting element E1, for example, ITO (Indium Tin Oxide), IZO (Indium Zinc Oxide), or the like can be used. Alternatively, the upper electrode 233 may be formed by a thin metal film capable of sufficiently passing the emitted light. As the material, for example, magnesium (Mg), silver (Ag), an alloy of this/these, or an alloy containing an alkali metal, an alkaline earth metal or the like can be used.

For the sealing layer 251, a light-transmitting insulating material advantageous in moisture proof, such as silicon oxide, silicon nitride, silicon oxynitride, aluminum oxide, or titanium oxide is used. For the planarization layer 252, a light-transmitting insulating material advantageous in forming the color filter layer 253 on the upper surface, such as silicon oxide, silicon nitride, or silicon oxynitride is used. For the color filter layer 253, a color resist advantageous in processing (patterning) and capable of passing light of a predetermined wavelength, for example, a photocuring resin, a UV curing resin, or the like can be used.

With the pixel structure ST1, when the light components emitted by the pixels 211 to 213 are combined, and their light amounts are adjusted, light of a variety of colors can be emitted. For example, when a driving voltage is applied between the lower electrode 231 and the upper electrode 233 in the pixel 211 (when the pixel 211 is driven), white light is generated in the portion of the organic compound layer 232 between the lower electrode 231 and the upper electrode 233. The white light changes to red light through the red filter 2531, and the red light is emitted to the upper side of the structure ST1. Similarly, for example, when the pixel 212 (or 213) is driven, green light (or blue light) that has passed through the green filter 2532 (or 2533) is emitted to the upper side of the structure ST1. The thickness of each layer may be decided such that the light components emitted by the pixels 211 and the like intensify each other by interference (see Japanese Patent Laid-Open No. 2018-78095).

Structure of Interpixel Electrode

The number of pixels 211 and the like (number of pixels) per unit area is expressed as a pixel density. It is considered that the pixel density is made high for the purpose of improving the accuracy of an image displayed on the displaying apparatus 1. On the other hand, it is considered that when the pixel density is raised, electric interference also called a crosstalk occurs between two pixels adjacent to each other, for example, between the pixels 211 and 212.

As an example of the electric interference, when a pixel (for example, the pixel 211) is driven, part of a carrier generated in a corresponding portion of the organic compound layer 232 passes through the organic compound layer 232, drifts to an adjacent pixel (for example, the pixel 212), and flows out. In this case, substantially, a pixel (here the pixel 212) different from the driving target (here, the pixel 211) is partially driven.

As another example of the electric interference or an example of an additional influence, when a pixel (for example, the pixel 212) is driven to emit light, part of the emitted light leaks to an adjacent pixel (for example, the pixel 213). In this case, a pixel (here the pixel 213) different from the driving target (here, the pixel 212) is partially driven.

That is, it can be said that since such electric interference may cause color mixture between pixels, a higher pixel density may lead to deterioration of the quality of an image.

Referring back to FIG. 2, the peripheral portion of the upper surface of the lower electrode 231 is covered with the insulating layer 241, and the center portion is exposed as an opening portion OP11. The area of the opening portion OP11 can be a parameter representing the quality of an image in the relationship with the pixel density. For example, the ratio of the area of the opening portion OP11 to an area corresponding to a single pixel can be expressed as an opening ratio. For example, it is considered that the opening ratio is increased for the purpose of increasing the light amounts of emitted light of the pixels 211 and the like and suppressing the driving voltage to implement a desired light amount.

To suppress the above-described electric interference, electrical isolation between the pixels needs to be appropriately performed. On the other hand, considering keeping the opening ratio high, such electrical isolation between the pixels is required to be implemented by a relatively simple structure (for example, by a form having a relatively small area and advantageous in manufacturing).

In this embodiment, the portion (the pixel boundary and the peripheral portion of the organic compound layer 232, which will be referred to as a pixel boundary portion hereinafter) of the organic compound layer 232 between the interpixel electrode 243 and the upper electrode 233 can be biased by the interpixel electrode 243. In this embodiment, the voltage supply unit 5 applies a predetermined voltage to the interpixel electrode 243. As another embodiment, the pixel boundary portion of the organic compound layer 232 may be biased based on the work function difference between the interpixel electrode 243 and the upper electrode 233.

By the bias, the electric field EF1 is generated in the pixel boundary portion of the organic compound layer 232. For this reason, a carrier (illustrated as a carrier CR1) that can be generated in the pixel 211 and drift to the adjacent pixel 212 is readily recombined by the electric field EF1 in the pixel boundary portion of the organic compound layer 232. Hence, according to this embodiment, a carrier CR2 that can reach the adjacent pixel 212 is reduced, that is, the flow-out of the carrier CR1 to the adjacent pixel 212 is appropriately reduced.

The voltage supplied to the interpixel electrode 243 is set to a voltage of the same polarity as the driving voltage supplied to the lower electrode 231. For example, in this embodiment, the values of voltages supplied to the lower electrode 231 and the interpixel electrode 243 are positive with respect to a reference voltage (here, the ground voltage) supplied to the upper electrode 233. The voltage value supplied to the lower electrode 231 and the voltage value supplied to the interpixel electrode 243 may be equal to or different from each other. Here, the voltage value supplied to the interpixel electrode 243 is set such that, for example, a minimum voltage necessary for light emission is applied to the pixel boundary portion of the organic compound layer 232. This makes it possible to prevent unnecessary light emission in the pixel boundary portion of the organic compound layer 232 and appropriately recombine only the carrier CR1 passing through the pixel boundary portion.

Additionally, in this embodiment, as is apparent from FIG. 2, the insulating member OX11 formed by the insulating layers 241 and 242 includes tilting surfaces on the upper side of the lower electrodes 231. Accordingly, portions of the organic compound layer 232 immediately above the tilting surfaces of the insulating member OX11 are relatively thin, and it can be said that the electrical resistance is high. Hence, according to this embodiment, the carrier CR2 that can reach the adjacent pixel 212 is further reduced, that is, the flow-out of the carrier CR1 to the adjacent pixel 212 is more appropriately reduced.

As shown in the enlarged schematic view of FIG. 2, in this embodiment, the side surfaces of the interpixel electrode 243 tilt such that the upper surface of the interpixel electrode 243 becomes wider than the bottom surface (tilting angle θ>90 [degrees]). Hence, light L11 generated in the pixel 212 and directed to the adjacent pixel 213 is substantially reflected downward by the side surface of the interpixel electrode 243, as indicated by L12. Hence, the leakage of the light L11 to the adjacent pixel 213 is appropriately reduced.

Here, letting $\varepsilon_1$ be the refractive index of the insulating layer 241, and $\varepsilon_2$ be the refractive index of the insulating layer 242, $\varepsilon_1 < \varepsilon_2$ preferably holds. In this case, since stray light that is directed upward by light scattering in the insulating layer 241 can be reflected downward by the boundary surface between the insulating layer 241 and the insulating layer 242, it can be said that the light L11 is more appropriately reflected downward. This more appropriately reduces the leakage of the light L11 to the adjacent pixel 213.

Note that it is also considered that the reflected light L12 is reflected upward by the boundary surface between the insulating layer 241 and the substrate 220, as indicated by L13. However, the light is reflected downward by the lower surface of the interpixel electrode 243, as indicated by L14. Hence, the reflected light L12 never reaches as stray light to another pixel 213.

As a summary, according to this embodiment, the electric interference between the pixels and leakage light to an adjacent pixel, which may additionally occur, is prevented or suppressed. Hence, according to this embodiment, it is possible to implement both a high pixel density and high quality of an image.

Manufacturing Method of Displaying Apparatus

The above-described displaying apparatus 1 can be manufactured using a known manufacturing process. FIGS. 3A to 3F are schematic views for explaining the manufacturing method of the displaying apparatus 1, and show, on a process basis, a state in which a pixel separation structure formed by the insulating layers 241 and 242 and the interpixel electrode 243 described mainly with reference to FIG. 2 is manufactured.

Figure 3A:
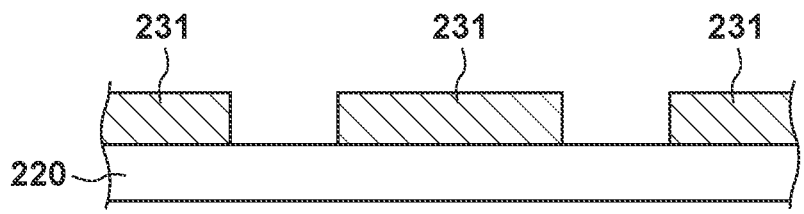
FIG. 3A is a schematic view for explaining an example of a manufacturing method of the displaying apparatus.

In the process shown in FIG. 3A, a plurality of lower electrodes 231 are formed at positions corresponding to a plurality of pixels 211 and the like on a substrate 220 using photolithography. That is, after a layer of a conductive material is formed on the substrate 220 by PVD (Physical Vapor Deposition) or the like, the layer of the conductive material is patterned by etching using a resist pattern, thereby forming the lower electrodes 231.

Figure 3B:
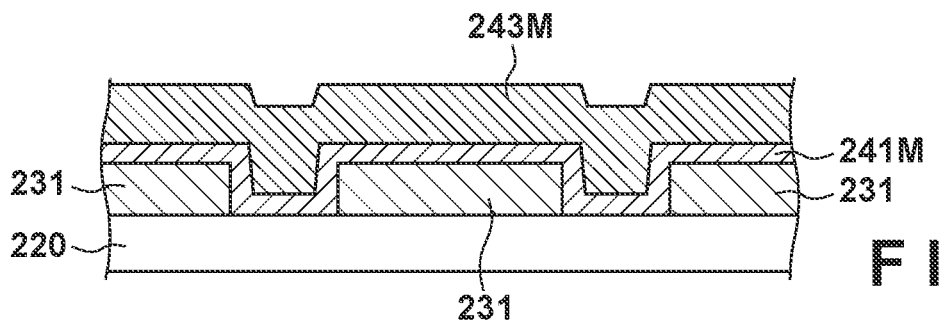
FIG. 3B is a schematic view for explaining an example of the manufacturing method of the displaying apparatus.

In the process shown in FIG. 3B, an insulating layer 241M is formed by CVD (Chemical Vapor Deposition) or the like on the structure obtained by the process shown in FIG. 3A. Here, the insulating layer 241M is formed to a thickness to cover the side surfaces of the lower electrodes 231 (not to fill the space between the lower electrodes 231 adjacent to each other). After that, a layer 243M of a conductive material is formed by PVD or the like on the insulating layer 241M.

Figure 3C:
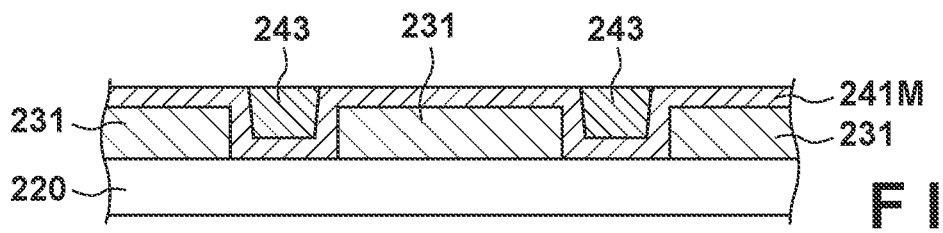
FIG. 3C is a schematic view for explaining an example of the manufacturing method of the displaying apparatus.

In the process shown in FIG. 3C, etch-back processing by etching or CMP (Chemical Mechanical Polishing) is performed for the structure obtained by the process shown in FIG. 3B to planarize the upper surface of the structure and expose the upper surface of the insulating layer 241M.

Figure 3D:
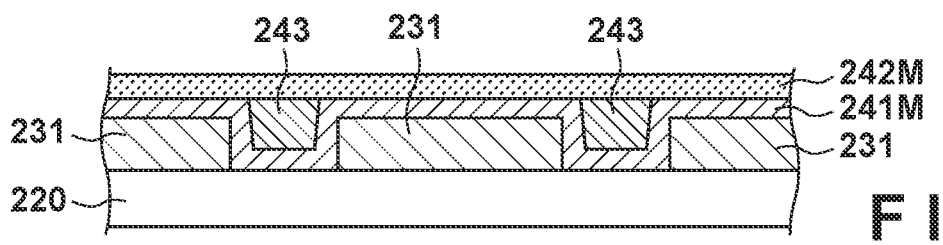
FIG. 3D is a schematic view for explaining an example of the manufacturing method of the displaying apparatus.

In the process shown in FIG. 3D, an insulating layer 242M is formed by CVD or the like on the structure obtained by the process shown in FIG. 3C.

Figure 3E:
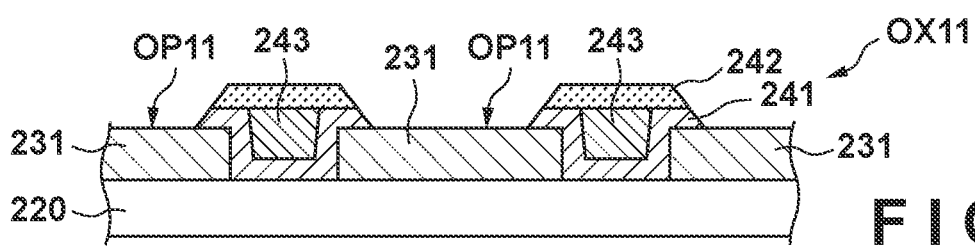
FIG. 3E is a schematic view for explaining an example of the manufacturing method of the displaying apparatus.

In the process shown in FIG. 3E, for the structure obtained by the process shown in FIG. 3D, the insulating layers 241M and 242M are patterned using photolithography to form insulating layers 241 and 242 (see FIG. 2) and expose the upper surfaces of the lower electrodes 231 as the opening portions OP11. According to this process, the upper surface of the insulating layer 241 and the upper surface of an interpixel electrode 243 form a continuous surface, and the continuous surface is covered with the insulating layer 242. Patterning of the insulating layers 241M and 242M is performed such that the side surfaces of the insulating layers 241 and 242 become tilting surfaces. This can prevent an organic compound layer 232 and an upper electrode 233, which are to be formed later, from being unexpectedly disconnected. The patterning may be done by isotropic etching, or may be implemented by performing anisotropic etching while changing etching conditions.

Figure 3F:
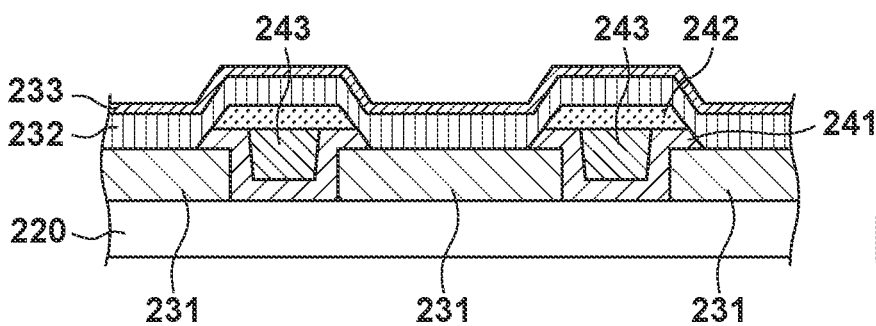
FIG. 3F is a schematic view for explaining an example of the manufacturing method of the displaying apparatus.

In the process shown in FIG. 3F, the organic compound layer 232 is formed by deposition on the structure obtained by the process shown in FIG. 3E and the upper electrode 233 is further formed on the organic compound layer 232. After that, a sealing layer 251, a planarization layer 252, and a color filter layer 253 are formed in accordance with a known procedure, thereby obtaining a pixel structure ST1.

According to the manufacturing method, as shown in the enlarged schematic view of FIG. 2, a distance W12 between the lower electrodes 231 adjacent to each other can be the minimum working size in a semiconductor manufacturing process, as will be described later in detail. Note that a width W13 of the lower electrode 231 covered with the insulating member OX11 is decided in consideration of manufacturing variations, position shifts, and the like. In this case, a distance W11 between the opening portions OP11 adjacent to each other can be represented by $$W11 = W12 + W13 \times 2$$

Comparison Between Embodiment and Reference Example

Figure 4:
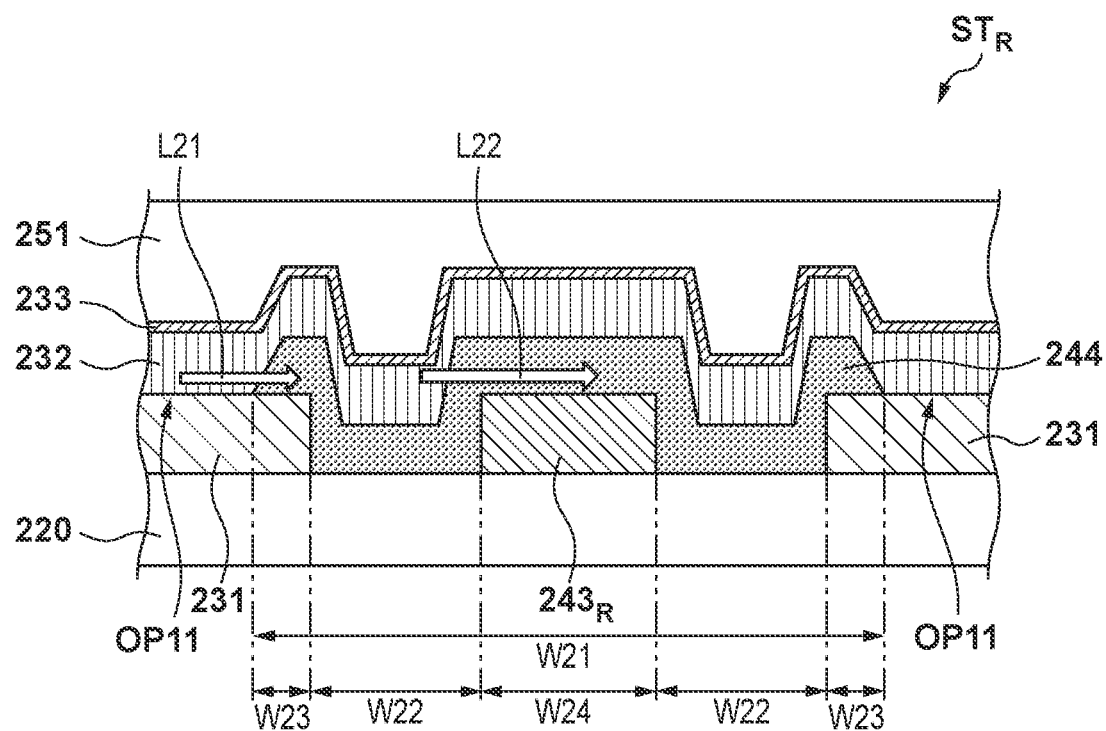
FIG. 4 is a schematic view for explaining a reference example of the pixel structure.

FIG. 4 shows a pixel structure $ST_R$ as a reference example. The pixel structure $ST_R$ includes, in place of the interpixel electrode 243, an interpixel electrode 243a configured to implement the same function as the interpixel electrode 243, and also includes an insulating film 244 that covers the interpixel electrode 243a in place of the insulating layers 241 and 242.

The interpixel electrode $243_R$ is provided by patterning a layer of a conductive material that forms the interpixel electrode $243_R$ after the formation of the plurality of lower electrodes 231 (or simultaneously with the formation of the plurality of lower electrodes 231). In this case, to minimize the distance between the lower electrodes 231 adjacent to each other, a width W24 of the interpixel electrode $243_R$ and a distance W22 between the lower electrode 231 and the interpixel electrode $243_R$ need to be the above-described minimum working size. Note that a width W23 of the lower electrode 231 covered with the insulating member OX11 is decided in consideration of manufacturing variations, position shifts, and the like, like the width W13. As a result, in the pixel structure $ST_R$, a distance W21 between the opening portions OP11 adjacent to each other can be represented by $$W21 = W24 + W22 \times 2 + W23 \times 2$$

Figure 5B:
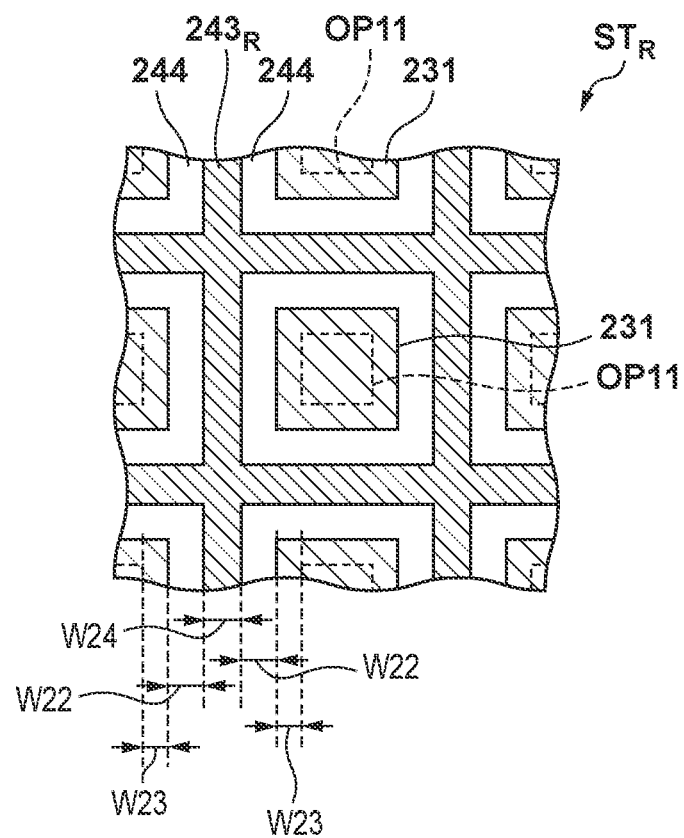
FIG. 5B is a schematic view for explaining the planar layout of the pixel structure.

FIG. 5A is a schematic view showing the planar layout of the pixel structure ST1 according to this embodiment. FIG. 5B is a schematic view showing the planar layout of the pixel structure $ST_R$ of the reference example. As described above, the width W11 in the pixel structure ST1 according to this embodiment can be represented by $$W11 = W12 + W13 \times 2$$

Here, considering that W12, W22, and W24 are the minimum working size (to be referred to as a minimum working size F), the widths W11 and W21 can be represented by $$W11 = W12 + W13 \times 2 = F + W13 \times 2, \text{ and}$$

$$W21 = W24 + W22 \times 2 + W23 \times 2 = F \times 3 + W23 \times 2$$

Here, if the widths W13 and W23 are decided under the same conditions (W13=W23), the width W11 is smaller than the width W21 by F×2 (twice of the minimum working size). That is, according to this embodiment, it can be said that the pixel density can be made higher than in the reference example.

Referring to the pixel structure $ST_R$ of the reference example (see FIG. 4), the interpixel electrode $243_R$ is provided at the same height as the lower electrodes 231. Hence, light L21 generated in a pixel and directed to an adjacent pixel is not appropriately shielded by the interpixel electrode $243_R$ (can enter the adjacent pixel), as indicated by L22, and may cause color mixture. On the other hand, according to this embodiment, as described with reference to the enlarged schematic view of FIG. 2, the light L11 directed to the adjacent pixel is appropriately shielded by the interpixel electrode 243, and color mixture does not occur. Hence, the quality of an image can improve as compared to the reference example.

From the above-described viewpoint, according to this embodiment, it can be said that it is possible to implement both a high pixel density and high quality of an image by a relatively simple arrangement.

Summary of First Embodiment

As described above, according to this embodiment, the interpixel electrode 243 is provided to divide the plurality of pixels 211 and the like between the plurality of lower electrodes 231, and in other words, extended along pixel boundaries. By the insulating layers 241 and 242, the interpixel electrode 243 is electrically independent of the plurality of lower electrodes 231. That is, a predetermined voltage is individually supplied to the interpixel electrode 243 via an electric path different from the plurality of lower electrodes 231. When the voltage is applied to the interpixel electrode 243, the predetermined electric field EF1 is generated in the portion of the organic compound layer 232 between the interpixel electrode 243 and the upper electrode 233. The electric field EF1 promotes, for example, recombination of the carrier CR1 (see FIG. 2) directed from the pixel 211 to an adjacent pixel, and thus prevents or suppresses the flow-out of the carrier CR1 to the adjacent pixel 212.

The value of the voltage supplied to the interpixel electrode 243 is preferably set to apply, to the portion of the organic compound layer 232 between the interpixel electrode 243 and the upper electrode 233, a minimum voltage necessary for the portion to emit light. The carrier CR1 is thus quickly recombined above the interpixel electrode 243, and hardly flows out to the adjacent pixel 212.

When the flow-out of the carrier CR1 to the adjacent pixel 212 is prevented, the electric interference between the pixels and an additional color mixture between the pixels can be prevented, and the quality of an image can be improved. Additionally, the electric interference between the pixels and the color mixture between the pixels can be a serious problem along with an increase in the pixel density. Hence, this embodiment is advantageous in implementing both a high pixel density and high quality of an image. In particular, from the viewpoint of the relationship with the reference example (as described with reference to FIGS. 2, 4, 5A, and 5B), according to this embodiment, it can be said that the above-described purposes can be achieved by a relatively simple arrangement.

In addition, according to this embodiment, the upper surface of the interpixel electrode 243 is located above the upper surface of each of the plurality of lower electrodes 231. For this reason, for example, the light L11 (see FIG. 2) generated in the pixel 212 and directed to the adjacent pixel 213 is blocked by the interpixel electrode 243 and hardly leaks to the adjacent pixel 213.

Also, according to this embodiment, the side surfaces of the interpixel electrode 243 tilt such that the upper surface of the interpixel electrode 243 becomes wider than the bottom surface (tilting angle θ>90 [degrees]). Hence, the light L11 is substantially reflected downward by the side surface of the interpixel electrode 243 (see the light L12). Further, letting $\varepsilon_1$ be the refractive index of the insulating layer 241, and $\varepsilon_2$ be the refractive index of the insulating layer 242, $\varepsilon_1 < \varepsilon_2$ preferably holds, and the light L11 is thus appropriately reflected downward. According to this structure, the leakage of the light L11 to the adjacent pixel 213 is appropriately prevented.

Modifications

Figure 6A:
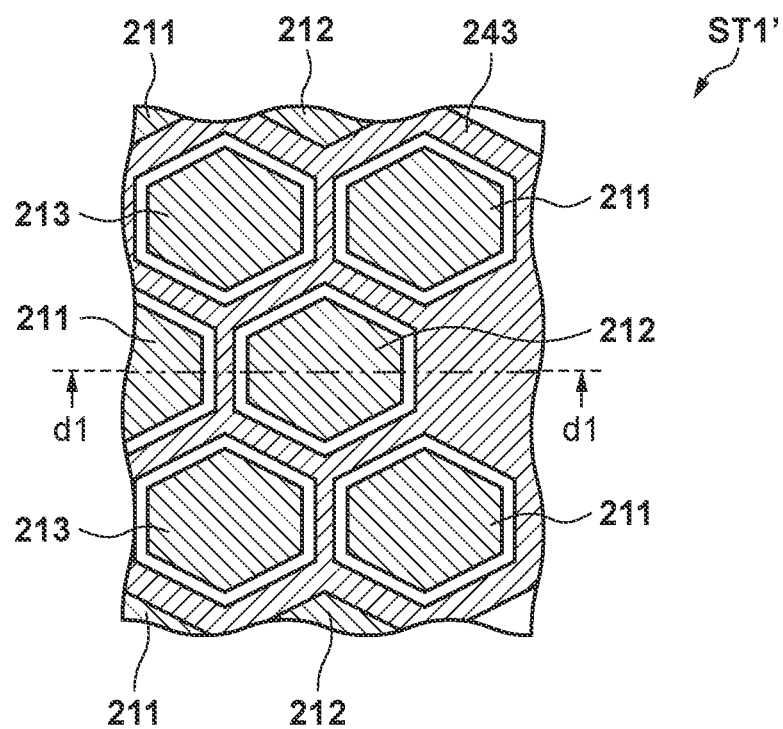
FIG. 6A is a schematic view for explaining another example of the pixel structure.

Various changes and modifications can be made for the contents of the first embodiment without departing from its scope. For example, the array form of the pixel array 2 is not limited to the example (so-called stripe array) shown in FIG. 5A, and another array form may be used. FIG. 6A shows, as an example, the planar layout of a pixel structure ST1' in which a honeycomb array is employed as the array form of the pixel array 2. In such an array form as well, the pixel array 2 can be driven by the same circuit arrangement as in FIG. 1A.

Figure 6B:
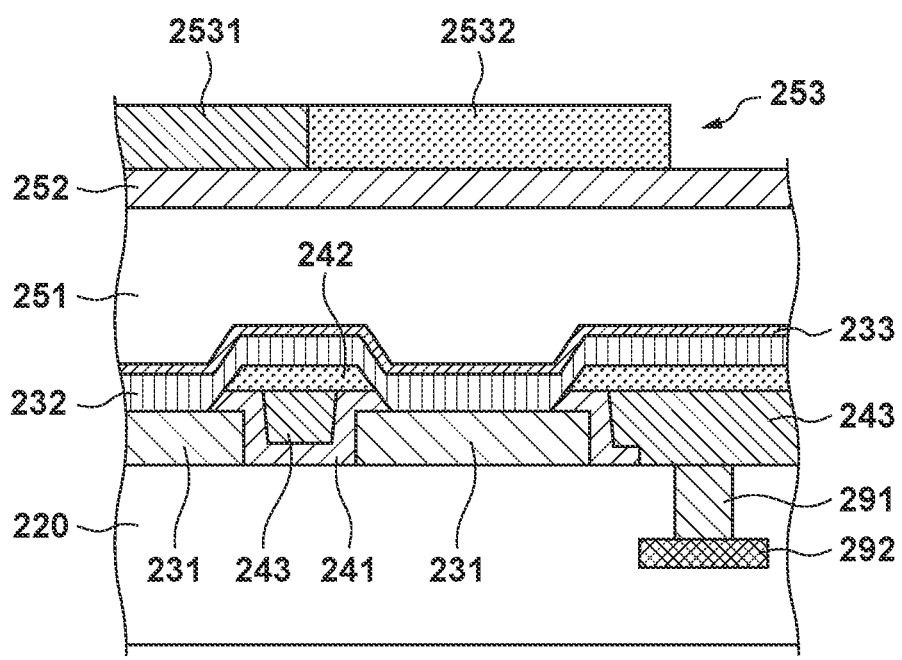
FIG. 6B is a schematic view for explaining another example of the pixel structure.

FIG. 6B is a schematic sectional view taken along a line d1-d1 in FIG. 6A. As is apparent from FIG. 6B, a plug 291 and an electrode portion 292 may be arranged at an end portion of the pixel region or in the connecting region (the region to electrically connect the pixel array 2 to the scanning signal driver 3, the information signal driver 4, or the voltage supply unit 5) outside the pixel region. The interpixel electrode 243 is extended all over the pixel region to divide the plurality of pixels 211 and the like (along the pixel boundaries). Hence, the plug 291 and the electrode portion 292 function as a connecting portion electrically connected to apply a predetermined voltage to the interpixel electrode 243 all over the pixel region.

In this example, the plug 291 and the electrode portion 292 are provided in the substrate 220. The electrode portion 292 is extended up to a position where an external electrode in the connecting region is provided, and can electrically be connected to the external electrode. In this example, the external electrode is provided on the lower surface side of the substrate 220. As another example, the external electrode may be provided on the upper surface side of the substrate 220.

Figure 7:
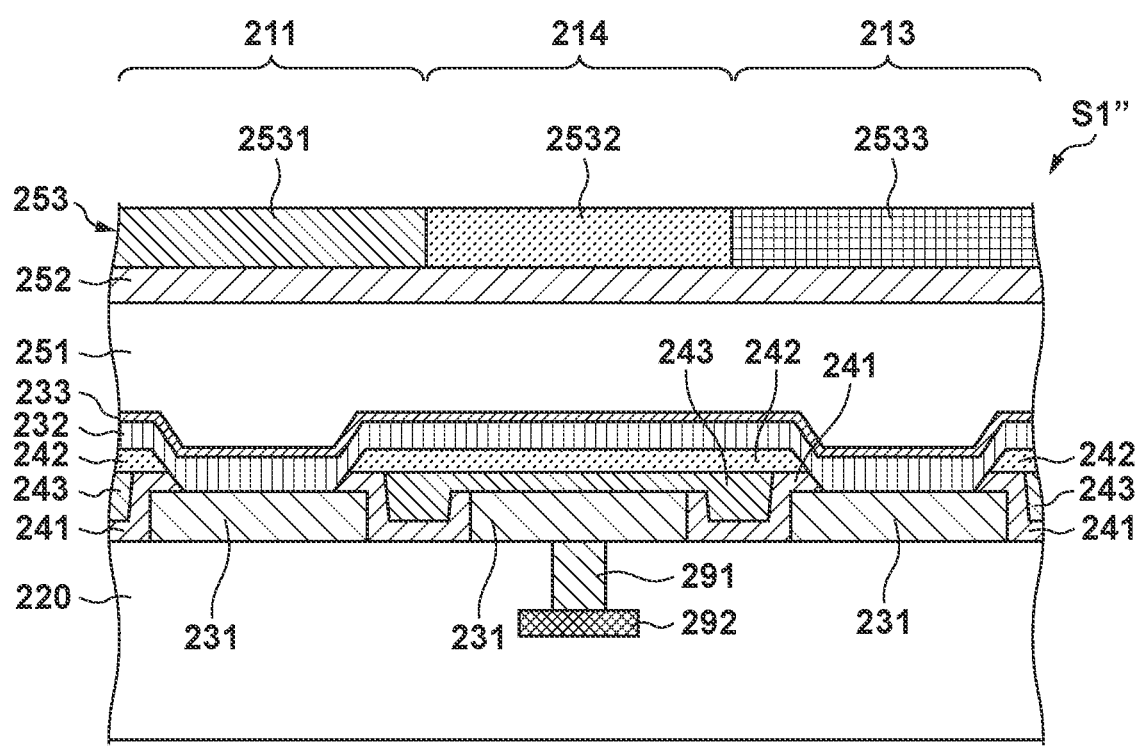
FIG. 7 is a schematic view for explaining another example of the pixel structure.

The plug 291 and the electrode portion 292 may be provided almost at the center portion in the pixel region, and may be provided, for example, at the position between the pixel 211 and the pixel 213 (at the position of the pixel 212 in place of the pixel 212), as indicated by a pixel structure ST1" in FIG. 7. That is, this pixel is provided as a dummy pixel 214 in place of the pixel 212, and the plug 291 and the electrode portion 292 are provided at a position overlap the dummy pixel 214 in a planar view. As described above, the interpixel electrode 243 is extended all over the pixel region. For this reason, according to the example shown in FIG. 7, a desired voltage can be supplied to the interpixel electrode 243 almost at the center portion in the pixel region.

Second Embodiment

Figure 8:
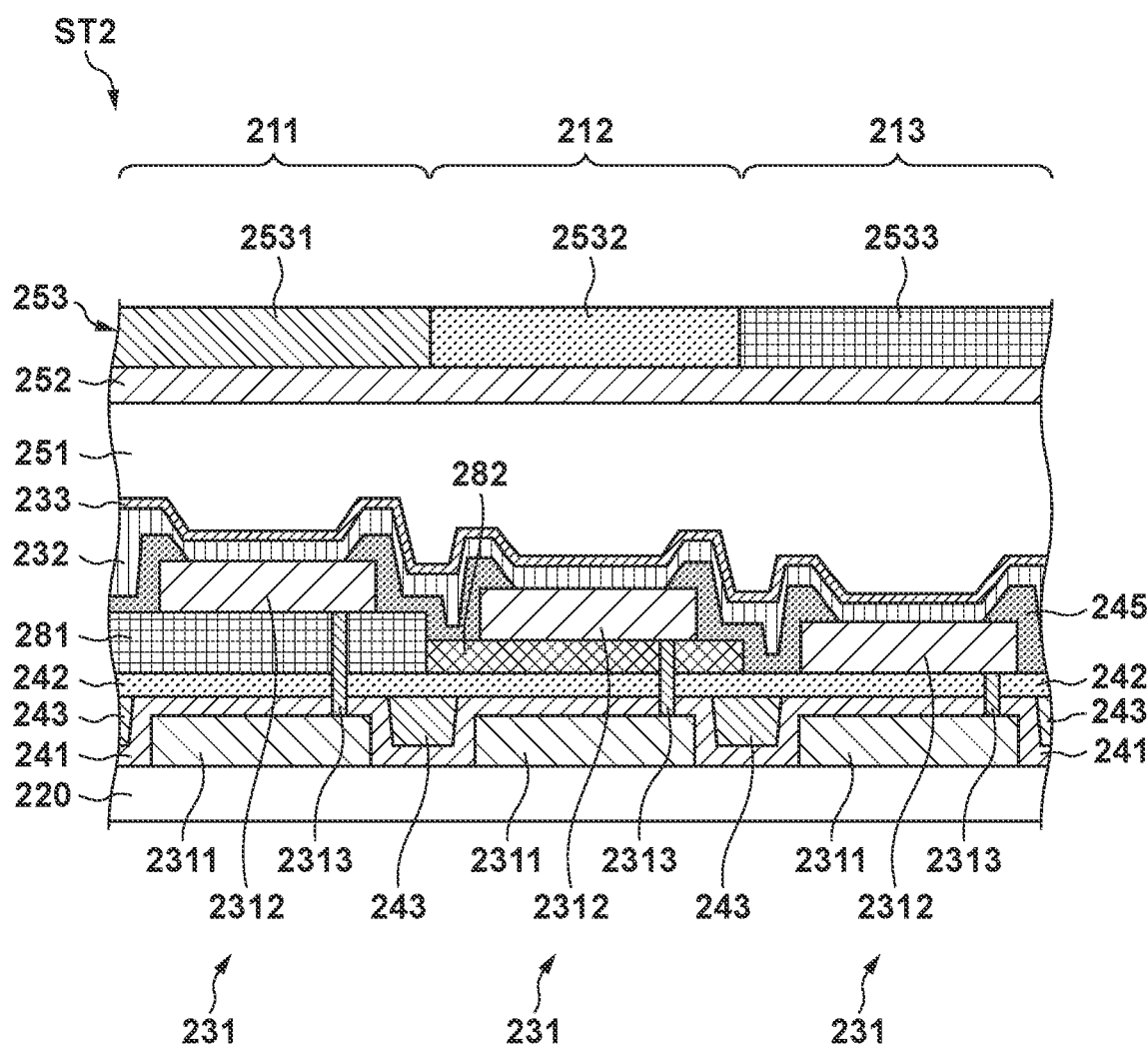
FIG. 8 is a schematic view for explaining another example of the pixel structure.

FIG. 8 is a schematic sectional view showing a pixel structure ST2 according to the second embodiment. As for individual elements shown in FIG. 8, the same reference numerals as in the above-described first embodiment denote elements that implement functions similar to those in the first embodiment, and the contents of the first embodiment are followed (a repetitive description will be omitted).

The pixel structure ST2 includes as a lower electrode 231, electrode portions 2311 and 2312 provided at positions apart from each other in the vertical direction, and a plug 2313 that electrically connects them. The first electrode portion 2311 is arranged on a substrate 220, and the second electrode portion 2312 is arranged on the plug 2313 above the electrode portion 2311.

The pixel structure ST2 further includes an optical adjustment layer (to be simply referred to as an "adjustment layer" hereinafter) 281 between the electrode portions 2311 and 2312 in a pixel 211, and further includes an optical adjustment layer (to be simply referred to as an "adjustment layer" hereinafter) 282 between the electrode portions 2311 and 2312 in a pixel 212. The adjustment layers 281 and 282 are insulating layers provided with thicknesses different from each other, and a light-transmitting insulating material (for example, a material similar to the insulating layers 241 and 242) can preferably be used.

With this structure, the electrode portions 2312 are located at heights different from each other in the pixels 211 to 213. That is, the electrode portions 2311 and 2312 are provided such that the distance between them in the vertical direction changes between the pixels. According to this structure, it is possible to implement a structure in which corresponding emitted light components intensify each other by interference. That is, the adjustment layers 281 and 282 are used to adjust the heights of the electrode portions 2312 and may be expressed as, for example, intermediate layers or the like from this viewpoint.

In this embodiment, an adjustment layer is not provided in the pixel 213. As another embodiment, another adjustment layer whose thickness is different from those of the adjustment layers 281 and 282 may be provided between the electrode portions 2311 and 2312 in the pixel 213.

The electrode portion 2311 may be expressed as a first lower electrode, and the electrode portion 2312 may be expressed as a second lower electrode. Alternatively, since the electrode portion 2312 directly functions as a lower electrode from the viewpoint of an organic compound layer 232, the electrode portion 2311 may be expressed as a substrate-side electrode, and the electrode portion 2312 may be expressed as a lower electrode.

Additionally, in this embodiment, the interpixel electrode 243 is provided between the electrode portions 2311 adjacent to each other. Additionally/alternatively, the interpixel electrode 243 may be provided between the electrode portions 2312 adjacent to each other. That is, the interpixel electrode 243 is provided between the electrode portions 2311 adjacent to each other and/or between the electrode portions 2312 adjacent to each other.

In the above-described embodiments, for the sake of easy understanding, the elements are denoted by names associated with their functions in the above description. However, the elements are not limited to those having, the contents described above as main functions, and may have the functions auxiliarily. In addition, individual terms described in this specification are merely used for the purpose of explaining the present invention, and the present invention is not limited to the strict meanings of the terms. For example, "unit/assembly/device/module" may be used in place of a term "apparatus", and vice versa.

Note that in this embodiment, an arrangement in which the organic light emitting element E1 is implemented by the organic compound layer 232 has been exemplified. The contents of the embodiment can also be applied to an arrangement including another light emitting element, for example, an inorganic light emitting element. In this case, one or more inorganic material layers forming a light emitting layer are provided in place of the organic compound layer 232.

(Experimental Results)

The displaying apparatus 1 according to the first embodiment was trially produced, and effects were evaluated as follows by diligent examinations of the present inventors.

First Experimental Example

As the first experimental example based on the above-described first embodiment, a displaying apparatus 1 (to be referred to as a "displaying apparatus $1_1$" hereinafter for the sake of discrimination) was produced by trial. In the first experimental example, the array form of a pixel array 2 was a stripe array (see FIG. 5A). For each of the lower electrodes 231 and the interpixel electrode 243, a layer made by stacking a tungsten layer on a titanium nitride layer was used. The lower electrode 231 was formed into an almost square shape of 2.4 [μm]×2.4 [μm]. A distance W12 between the lower electrodes 231 adjacent to each other was 0.2 [μm] complying with the minimum working size. For the insulating layers 241 and 242 forming the insulating member OX11, silicon oxide was used, and both insulating layers had a thickness of about 30 [nm]. A width W13 of the lower electrode 231 covered with the insulating member OX11 was 0.2 [μm] complying with the minimum working size. In this design form, the number of pixels in a unit region of 1 [mm]×1 [mm] was 384, and the opening ratio was 59 [%].

As an organic compound layer 232, a layer made by stacking a hole injection layer, a hole transport layer, an electron block layer, a first light emitting layer, a second light emitting layer, an electron transport layer, and an electron injection layer in this order was used. For the hole injection layer, a compound A1 was used (thickness: about 7 [nm]). For the hole transport layer, a compound A2 was used (thickness: about 5 [nm]). For the electron block layer, a compound A3 was used (thickness: about 10 [nm]). For the first light emitting layer, a material using a compound A4 as a base material and containing a compound A5 at a weight ratio of 3 [%] was used (thickness: about 10 [nm]). For the second light emitting layer, a material using the compound A4 as a base material and containing a compound A6 at a weight ratio of 1 [%] was used (thickness: about 10 [nm]). For the electron transport layer, a compound A7 was used (thickness: about 34 [nm]). For the electron injection layer, lithium fluoride (LiF) was used (thickness: about 0.5 [nm]).

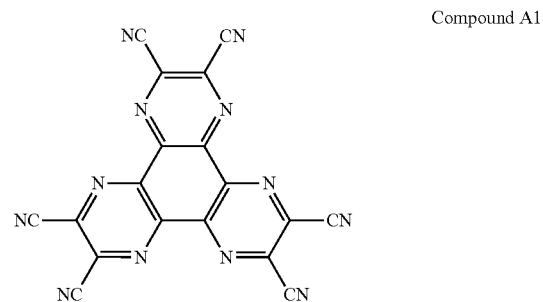

Compound A1

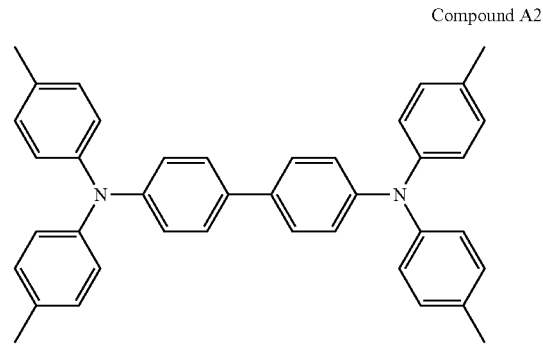

Compound A2

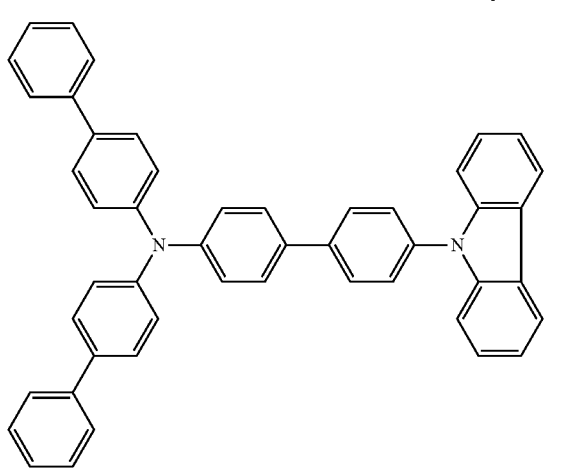

Compound A3

-continued

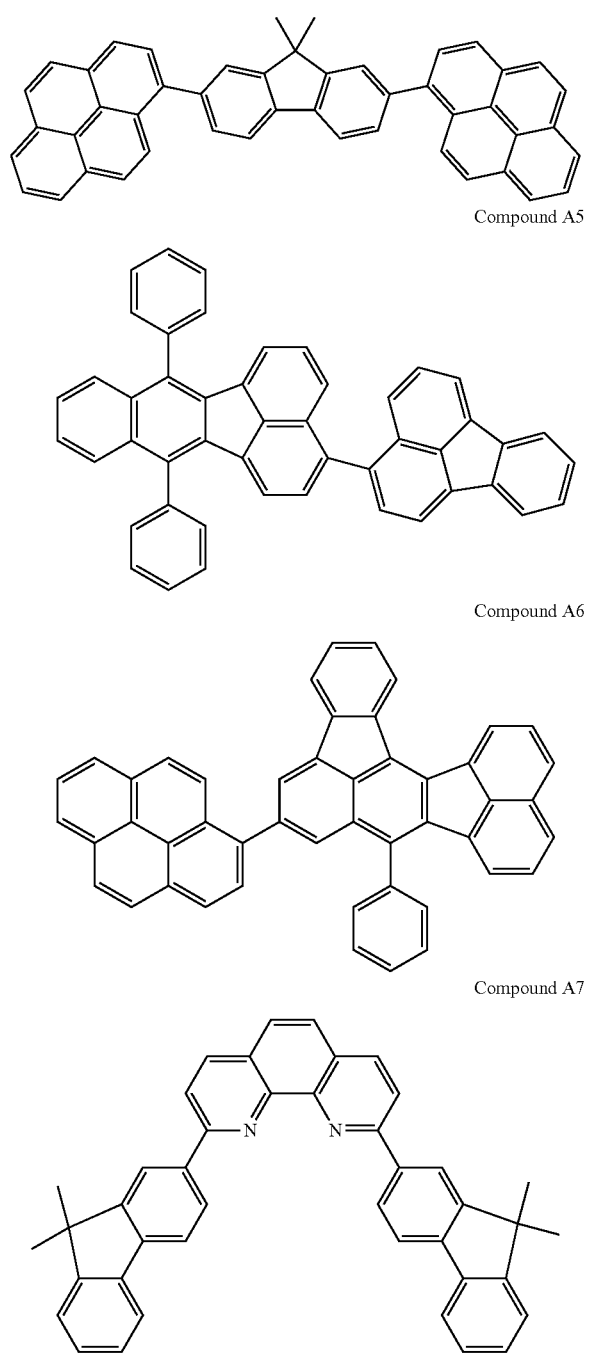

Additionally, for an upper electrode 233, an alloy of magnesium (Mg) and silver (Ag) (composition ratio: 1:1) was used (thickness: about 10 [nm]). For a sealing layer 251, silicon nitride was used (thickness: about 1.5 [m]). A color filter layer 253 is formed on a planarization layer 252 on the sealing layer 251.

To each of pixels 211 and the like as a driving target, a driving current for a brightness of 5 [cd/m²] was supplied. A voltage was applied to the lower electrodes 231 such that the current density of the pixels 211 and the like as non-driving targets became $1\times10^{-3}$ [mA/cm²] or less. The driving voltage used to drive the pixels 211 and the like was 2 [V] or more. Additionally, both the interpixel electrode 243 and the upper electrode 233 were set to the ground voltage (0 [V]).

The color gamut (color reproduction range (Gamut)) of the pixel array 2 of the displaying apparatus $1_1$ was about 65 [%]. The minimum voltage (threshold voltage) necessary for an organic light emitting element E1 to emit light is about 2 [V]. For this reason, even if a voltage of 1.5 [V] is applied between the lower electrode 231 and the upper electrode 233, a current is not substantially generated between them. As an example, a leakage current obtained when a voltage of 1.5 [V] was applied between the lower electrode 231 and the upper electrode 233 in the pixel 211 was the measurement limit (less than $10^{-6}$ [nA/unit pixel]), and electric interference between the pixels was not substantially observed. In addition, when the pixel 212 was driven by supplying a current with a current density of 100 [mA/cm²], the brightness of the pixel 212 was 250 [cd/m²].

Second Experimental Example

Next, the displaying apparatus 1 (to be referred to as a "displaying apparatus $1_2$" hereinafter for the sake of discrimination) as the second experimental example is the same as the displaying apparatus $1_1$ of the first experimental example except that the voltage applied to an interpixel electrode 243 is 5 [V]. The color gamut of a pixel array 2 of the displaying apparatus $1_2$ was about 70 [%]. That is, it is found that when a predetermined voltage is applied to the interpixel electrode 243, a carrier CR1 passing through the pixel boundary portion of an organic compound layer 232 is appropriately recombined (see FIG. 2), and a leakage current between pixels is thus reduced.

First Comparative Example

For comparison with the first and second experimental examples, as the first comparative example based on the above-described reference example, a displaying apparatus 1 (to be referred to as a "displaying apparatus $1_{1R}$" hereinafter for the sake of discrimination) having a pixel structure $ST_R$ (see FIGS. 4 and 5B) was similarly trially produced. Here, widths W22, W23, and W24 were 0.2 [μm] complying with the minimum working size, that is, the same as in the first experimental example. In addition, to obtain an opening ratio of 59 [%] as in the first experimental example, a lower electrode 231 was formed into an almost square shape of 3.69 [μm]×3.69 [μm]. In this design form, since the number of pixels in a unit region of 1 [mm]×1 [mm] was 233, it can be said that the pixel density is difficult to increase. In addition, a leakage current obtained when a voltage of 1.5 [V] was applied between the lower electrode 231 and an upper electrode 233 in a pixel 211 was about $2\times10^{-3}$ [nA/unit pixel]. That is, the leakage current between the upper electrode and the lower electrode was larger than in the first experimental example.

Second Comparative Example

In addition, a displaying apparatus 1 (to be referred to as a "displaying apparatus $1_{2R}$" hereinafter for the sake of discrimination) as the second comparative example is the same as the displaying apparatus $1_{1R}$ of the first comparative example except that the number of pixels in a unit region of 1 [mm]×1 [mm] was 384, and as a result, the opening ratio was 38 [%]. In the displaying apparatus $1_{2R}$, when a pixel 212 was driven by supplying a current with a current density of 100 [mA/cm$^2$], the brightness of the pixel 212 was 250 [cd/m$^2$], that is, the brightness was lower than in the first experimental example.

As is apparent from the above description, it can be said that the displaying apparatuses $1_1$ and $1_2$ according to the first and second experimental examples are advantageous in implementing both a high pixel density and high quality of an image in comparison with the displaying apparatuses $1_{1R}$ and $1_{2R}$ according to the first and second comparative examples.

Application Examples

The displaying apparatus 1 according to the embodiment can be applied to a variety of electric devices such as the electronic viewfinder of a camera, the display of a TV, the display panel of a portable device, and the like.

Figure 9A:
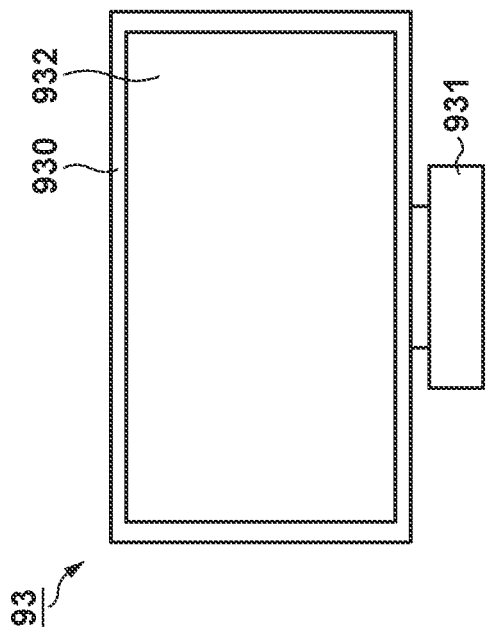
FIG. 9A is a view for explaining an application example of the displaying apparatus.

FIG. 9A is a schematic view of an image capturing apparatus 91. The image capturing apparatus 91 includes an operation unit 911, a rear display 912, and an electronic viewfinder 913 attached to a housing 910. A user can capture an image of a desired object using the operation unit 911, and confirm the image obtained by the image capturing on the rear display 912. The displaying apparatus 1 can be applied to the electronic viewfinder 913. When performing image capturing, the user can confirm the object and the peripheral environment of the object using the electronic viewfinder 913. Note that the concept of the image capturing apparatus 91 includes not only a camera having the image capturing function as a main function but also a device auxiliarily having the image capturing function.

Figure 9B:
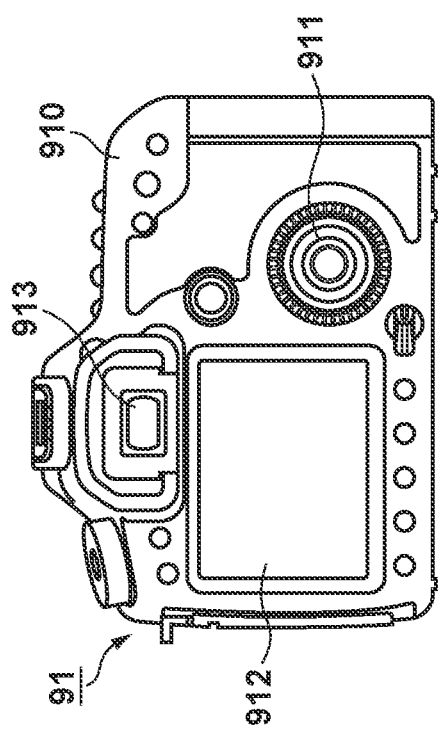
FIG. 9B is a view for explaining an application example of the displaying apparatus.

FIG. 9B is a schematic view of a portable device 92. The portable device 92 includes a display unit 921 and an operation unit 922 attached to a housing 920. The displaying apparatus 1 can be applied to the display unit 921. A user can cause the display unit 921 to display a desired image using the operation unit 922. The display unit 921 also has another function as an operation unit, and can also function as a touch panel. Note that examples of the portable device 92 include a portable type electronic device and a mobile device and, for example, not only a portable telephone such as a smartphone but also a game device.

Figure 9C:
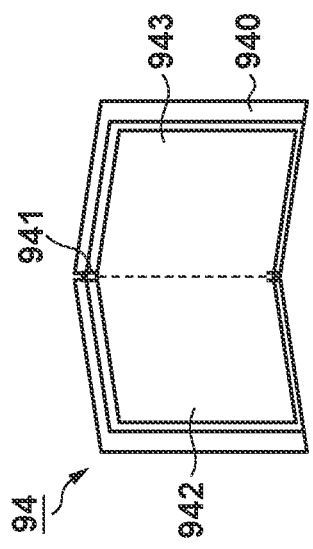
FIG. 9C is a view for explaining an application example of the displaying apparatus.

FIG. 9C is a schematic view of a monitor apparatus 93. The monitor apparatus 93 includes a frame 930, a support base 931 that supports the frame 930, and a display unit 932 surrounded by the frame 930. The displaying apparatus 1 can be applied to the display unit 932. A user can cause the display unit 932 to display a desired image using a remote controller (not shown) or using an operation unit provided on the frame 930 or the support base 931. Note that the monitor apparatus 93 need only be an apparatus capable of displaying a desired video. The concept of the monitor apparatus 93 includes a TV monitor (broadcast receiver), a monitor for a personal computer, and the like.

Figure 9D:
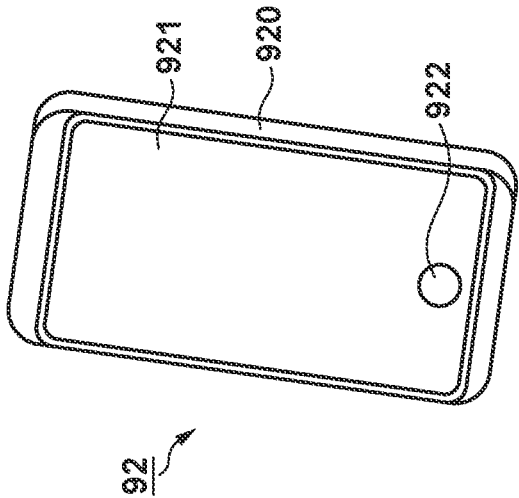
FIG. 9D is a view for explaining an application example of the displaying apparatus.

FIG. 9D is a schematic view of a foldable type device 94. The device 94 includes a housing 940, a bending portion 941 that makes the housing 940 foldable, a first display unit 942, and a second display unit 943. The first display unit 942 and the second display unit 943 are attached to the housing 940 on both sides of the bending portion 941. For example, in a state in which the housing 940 is folded and closed, the first display unit 942 and the second display unit 943 are in a rest state. In a state in which the housing 940 is opened, the first display unit 942 and the second display unit 943 are in a driven state. The displaying apparatus 1 can be applied to each of the first display unit 942 and the second display unit 943. The first display unit 942 and the second display unit 943 can display images different from each other. In addition, one image can be displayed by them. One or both of the first display unit 942 and the second display unit 943 have a function as an operation unit, and can also function as a touch panel. Note that the concept of the device 94 includes, for example, not only a display (so-called foldable display) but also a tablet terminal such as a smartphone (so-called foldable phone).

According to the present invention, it is possible to implement both a high pixel density and high quality of an image.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-098810, filed on May 27, 2019, which is hereby incorporated by reference herein in its entirety.

What is claimed is:

1. A displaying apparatus in which a plurality of pixels each including an organic light emitting element are arrayed in a pixel region, comprising:
   a plurality of lower electrodes arrayed on a substrate in correspondence with the plurality of pixels;
   a first insulating layer configured to cover an upper surface of the substrate and at least side surfaces of the plurality of lower electrodes to electrically isolate the plurality of lower electrodes from each other;
   an organic compound layer provided all over the pixel region to cover the plurality of lower electrodes and the first insulating layer;
   an upper electrode provided all over the pixel region to cover the organic compound layer; and
   an interpixel electrode provided between the plurality of lower electrodes to be arranged along a boundary of the plurality of pixels under the organic compound layer and above the first insulating layer.

2. The displaying apparatus according to claim 1, wherein the interpixel electrode is electrically independent of the plurality of lower electrodes.

3. The displaying apparatus according to claim 1, further comprising a second insulating layer provided on the first insulating layer to cover an upper surface of the interpixel electrode and electrically isolate the interpixel electrode from the organic compound layer.

4. The displaying apparatus according to claim 3, wherein an upper surface of the first insulating layer and the upper surface of the interpixel electrode form a continuous surface, and the second insulating layer covers the continuous surface.

5. The displaying apparatus according to claim 3, wherein letting $\varepsilon_1$ be a refractive index of the first insulating layer for light emitted by the organic light emitting element, and $\varepsilon_2$ be a refractive index of the second insulating layer for the emitted light, $\varepsilon_1 < \varepsilon_2$ holds.

6. The displaying apparatus according to claim 3, wherein the first insulating layer is provided to cover a peripheral portion of an upper surface of each of the plurality of lower electrodes while exposing a center portion.

7. The displaying apparatus according to claim 1, wherein an upper surface of the interpixel electrode is located above an upper surface of each of the plurality of lower electrodes.

8. The displaying apparatus according to claim 1, wherein a lower surface of the interpixel electrode is located above a lower surface of each of the plurality of lower electrodes.

9. The displaying apparatus according to claim 1, wherein a side surface of the interpixel electrode tilts such that an upper surface of the interpixel electrode is wider than a bottom surface.

10. The displaying apparatus according to claim 1, further comprising a connecting portion electrically connected to apply a predetermined voltage to the interpixel electrode.

11. The displaying apparatus according to claim 10, wherein the connecting portion is provided outside the pixel region in a planar view.

12. The displaying apparatus according to claim 10, wherein one of the plurality of pixels is a dummy pixel, and
the connecting portion is provided at a position overlapping the dummy pixel in the pixel region in a planar view.

13. The displaying apparatus according to claim 1, wherein each of the plurality of lower electrodes includes a first electrode portion, and a second electrode portion arranged on a plug on the first electrode portion, and
the interpixel electrode is provided between the first electrode portions adjacent to each other and/or between the second electrode portions adjacent to each other.

14. The displaying apparatus according to claim 13, wherein the first electrode portion and the second electrode portion are provided such that a distance between the first electrode portion and the second electrode portion in a vertical direction changes between the pixels.

15. The displaying apparatus according to claim 1, further comprising a driving portion configured to supply a voltage to the upper electrode, the plurality of lower electrodes, and the interpixel electrode to drive the plurality of pixels,
wherein the driving portion
supplies a reference voltage to the upper electrode,
supplies a driving voltage different from the reference voltage to at least one of the plurality of lower electrodes corresponding to a pixel of a driving target, and
supplies, to the interpixel electrode, a predetermined voltage of the same polarity as the driving voltage with respect to the reference voltage.

16. The displaying apparatus according to claim 15, wherein the driving portion supplies the predetermined voltage to the interpixel electrode to apply, to a portion of the organic compound layer between the interpixel electrode and the upper electrode, a minimum voltage necessary for the portion to emit light.

17. The displaying apparatus according to claim 1, further comprising color filter layers provided above the upper electrode in correspondence with the plurality of pixels.

18. An electric apparatus comprising the displaying apparatus of claim 1.

19. A manufacturing method of a displaying apparatus in which a plurality of pixels each including an organic light emitting element are arrayed in a pixel region, comprising:
forming a plurality of lower electrodes on a substrate in correspondence with the plurality of pixels;
forming a first insulating layer configured to cover an upper surface of the substrate and at least side surfaces of the plurality of lower electrodes to electrically isolate the plurality of lower electrodes from each other;
forming an organic compound layer all over the pixel region to cover the plurality of lower electrodes and the first insulating layer;
forming an upper electrode all over the pixel region to cover the organic compound layer; and
forming, after the forming the first insulating layer before the forming the organic compound layer, an interpixel electrode between the plurality of lower electrodes to be arranged along a boundary of the plurality of pixels above the first insulating layer.

* * * * *